(12) United States Patent
Han et al.

(10) Patent No.: US 6,429,479 B1
(45) Date of Patent: Aug. 6, 2002

(54) NAND FLASH MEMORY WITH SPECIFIED GATE OXIDE THICKNESS

(75) Inventors: K. Michael Han, San Jose; Hao Fang, Cupertino; Masaaki Higashitani, Sunnyvale, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/522,247

(22) Filed: Mar. 9, 2000

(51) Int. Cl.[7] .............................................. H01L 29/788
(52) U.S. Cl. ........................ 257/315; 438/201; 438/211; 438/257
(58) Field of Search .......................... 257/315; 438/201, 438/211, 257

(56) References Cited

U.S. PATENT DOCUMENTS

| | | | |
|---|---|---|---|
| 5,587,948 A | * 12/1996 | Nakai ..................... | 365/185.17 |
| 5,590,072 A | 12/1996 | Choi ...................... | 365/185.01 |
| 5,877,980 A | 3/1999 | Mang et al. ........... | 365/185.17 |
| 6,157,575 A | * 12/2000 | Choi ..................... | 365/185.29 |

FOREIGN PATENT DOCUMENTS

JP          10150170 A   *  6/1998   .........  H01L/27/115

OTHER PUBLICATIONS

Wolf, Silicon Processing for the VLSI Era, 1990, Lattice Press, vol. 2, p. 627.*

* cited by examiner

*Primary Examiner*—Nathan Flynn
*Assistant Examiner*—Scott Wilson
(74) *Attorney, Agent, or Firm*—Skjerven Morrill LLP

(57) ABSTRACT

A single tunnel gate oxidation process for fabricating NAND memory strings where the gate oxide of the select transistors and the floating gate memory transistors are fabricated in a single oxidation step is disclosed. The select gate transistors and the floating gate memory transistors have an oxide thickness of 85 Å–105 Å. For single tunnel gate approach, a careful selection of the medium doped source/drain region implant conditions is necessary for proper function of the NAND memory string. In one embodiment, the medium doped source/drain region is doped with Arsenic to a concentrations of $10^{13}$–$10^{14}$/cm$^2$.

19 Claims, 4 Drawing Sheets

NAND FLASH MEMORY WITH SPECIFIED GATE OXIDE THICKNESS

BACKGROUND

1. Field of Invention

The present invention relates generally to integrated circuits and methods of fabricating such circuits and, more specifically, NAND flash memory cells and methods of fabrication thereof.

2. Description of the Prior Art

A NAND-structured memory string has several floating gate memory transistors (typically 8 or 16) connected in series between two select gates. The area occupied by the memory transistors is called the core region. The control gates of the memory transistors are connected to other parallel NAND strings by wordlines to form a NAND memory array. The parallel NAND strings are separated by a core field oxide region.

NAND flash memory strings are typically fabricated using a "dual-gate oxidation" process where the gate oxide of the select transistors is first thermally grown on a silicon substrate. The select transistor areas are then masked with photo-resist and the gate oxide in the core region is etched away, typically in a buffer oxide etch process, to expose the silicon substrate. The photo-resist is then removed and the gate oxide is thermally regrown to define the final gate oxide thickness of the two select gate transistors and the sixteen floating gate memory transistors. This approach resulted in a select transistor gate oxide thickness of 150Å–180Å and a memory transistor gate oxide thickness of 85 Å–105 Å, as illustrated in FIG. 1. FIG. 1 shows a select transistor area 12 and a core transistor area 13. The oxide layer 14 grown over the P-well 11 is thicker in select transistor area 12 than in core transistor area 13. The select gate oxide is thicker than the core tunnel oxide in order to prevent band-to-band tunneling current between source/drain region 17 and P-well 11. In order for the select gate to function in spite of the thick select gate oxide, source/drain region 17 must be doped.

Making the select gate oxide thicker than the core tunnel oxide adds several steps to the fabrication of the NAND string. Additional processing steps increase the cost of fabricating the device. Further, these additional steps can affect the reliability of the NAND string. For example, the masking and etching steps can leave contaminants on the surface of the NAND string or introduce defects into the NAND string. Such contaminants and defects can degrade the core tunnel oxide and, as a result, lead to poor reliability of the memory cells. Also, the masking step increases the amount of space required for the NAND string because imprecision inherent in any masking step requires that a tolerance area be masked in addition to the select gate area.

SUMMARY OF THE INVENTION

The present invention provides a single tunnel gate oxidation process for fabricating NAND memory strings where the gate oxide of the select transistors and the 16 floating gate memory transistors are fabricated in a single oxidation step. The oxidation process can be either dry, wet or nitrided. The two select gate transistors and the floating gate memory transistors have the same oxide thickness (85 Å–105 Å). In one embodiment, the medium doped source/drain region is doped with Arsenic to a concentration of $10^{13}$–$10^{14}$/cm$^2$.

Several advantages result from this method for fabricating the NAND memory arrays. First, eliminating a masking step, eliminating a thermal cycle, and eliminating associated cleaning steps simplifies the fabrication of the device, thus lowering the cost and allowing fabrication of a more compact device. Also, elimination of the masking step improves the isolation property of the core field oxide layer separating the strings, which reduces program disturb and increases the coupling ratio between the floating gate and the control gate in the core memory cells. Further, a NAND string formed by the single tunnel gate oxidation process can be programmed or erased at a lower voltage. In addition, the medium doped source/drain region used in the single tunnel gate oxidation process reduces the band-to-band tunneling current.

DETAILED DESCRIPTION

Figure 1:
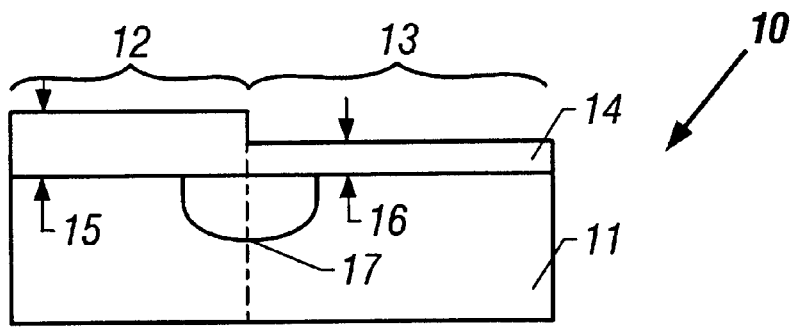
FIG. 1 shows a select gate and a memory cell of a NAND flash memory according to the prior art.
Figure 2:
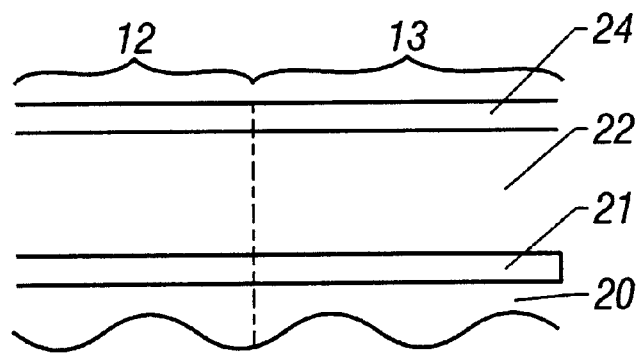
FIGS. 2–6 are simplified cross-sectional views of a select gate and a memory cell of a NAND flash memory illustrating various stages in the fabrication of an embodiment of the present invention.
Figure 7:
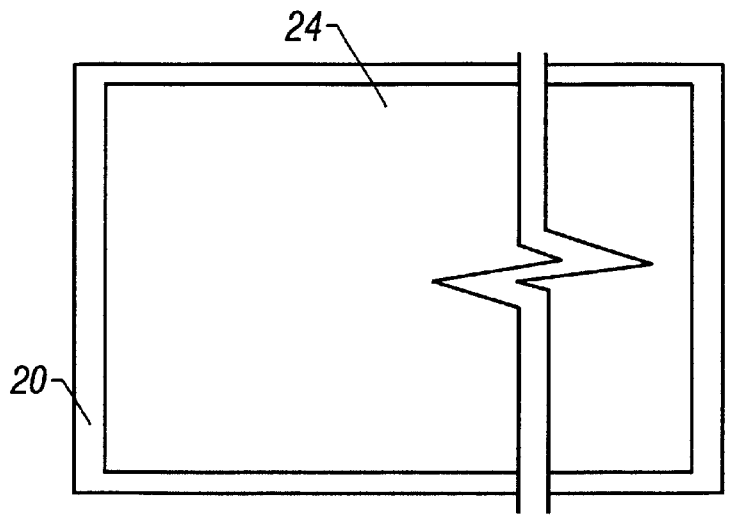
FIGS. 7–11 are simplified top views of a portion of a NAND memory array illustrating various stages in the fabrication of an embodiment of the present invention.

FIG. 2 shows a simplified cross section of an embodiment of the present invention depicting a select gate area 12 and a core memory cell 13 of a single NAND string at an early stage in fabrication. The NAND string also includes several more core memory cells connected in series with depicted core memory cell 13 and an additional select gate connected to the last one of the several more core memory cells. In addition, the NAND string is connected to several other parallel NAND strings to form a NAND array. The portion shown includes a P-well 22 formed in an N-well 21, which is formed in substrate 20. The entire NAND array is formed in P-well 22. A layer of oxide 24 is formed over P-well 22. The portion of oxide layer 24 in area 12 is the select gate oxide. The portion of oxide layer 24 in area 13 is the tunnel oxide of memory cell 13. The select gate oxide and the tunnel oxide are the same thickness. In one embodiment, oxide layer 24 is 85–105Å thick. Oxide layer 24 may be formed by wet oxidation or dry oxidation, or may be formed by either wet or dry oxidation followed by nitridation. FIG. 7 illustrates a top view of a portion of a NAND array. Oxide layer 24 is formed over a P-well (not shown) in substrate 20. A core field oxide layer between the NAND strings is defined before oxide layer 24 is formed.

Figure 3:
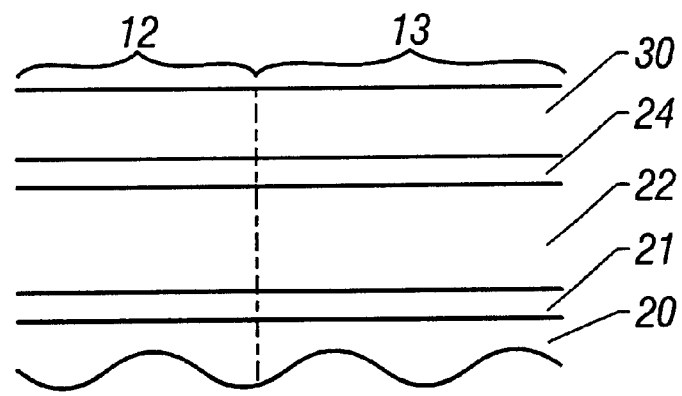
Figure 8:
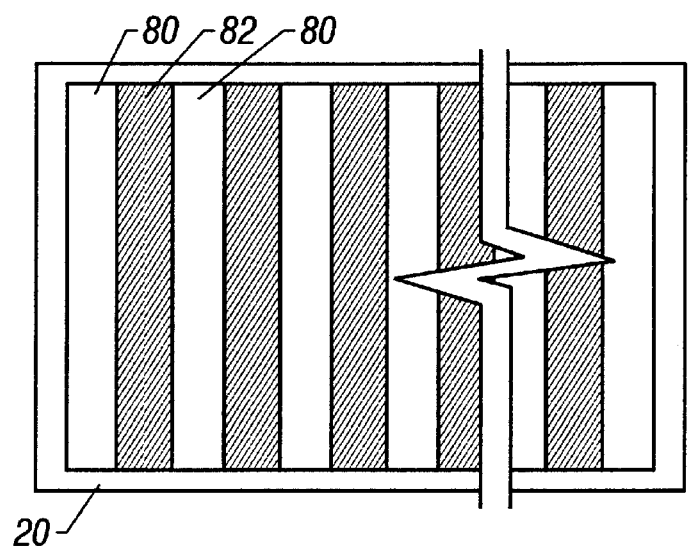

Referring now to FIG. 3, a first layer of polysilicon 30 is formed over oxide layer 24. First polysilicon layer 30 forms the floating gates of the memory cell transistors. FIG. 8 illustrates a top view of a portion of a NAND array. First polysilicon layer 30 of FIG. 3 is formed by masking the areas 82 between NAND strings 80 to define the floating gates of the memory cells. The first polysilicon layer is etched to remove the polysilicon formed over the core field oxide layer, then a channel stop implant is performed. In one embodiment, first polysilicon layer 30 is formed by chemical vapor deposition.

Figure 4:
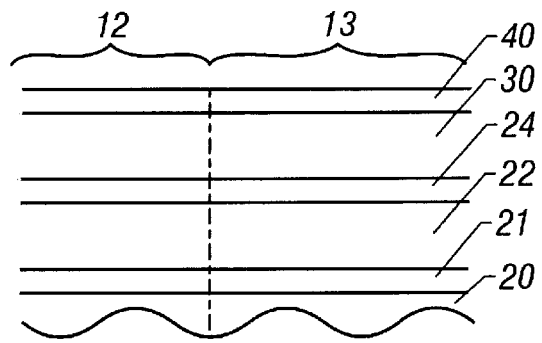
Figure 9:
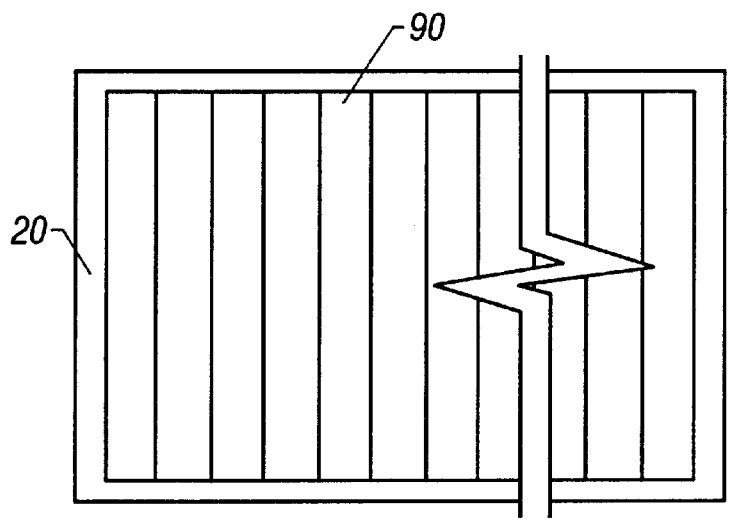

Turning now to FIG. 4, separation layer 40 is formed on first polysilicon layer 30. Separation layer 40 separates the floating gates of the core memory cells from the control gates of the core memory cells. In one embodiment, separation layer 40 is an ONO layer formed by first depositing an oxide layer by high temperature chemical vapor deposition oxidation, then depositing a nitride layer, then depositing a second oxide layer on top of the nitride layer by wet oxidation. In another embodiment, separation layer 40 is a nitride layer. FIG. 9 illustrates a top view of a portion of a NAND array with a separation layer 90 formed over the NAND array.

Figure 5:
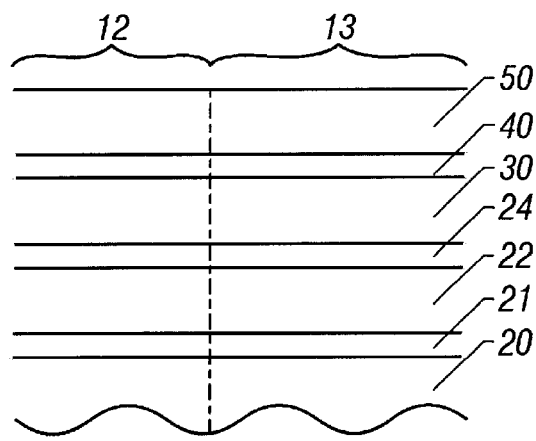
Figure 10:
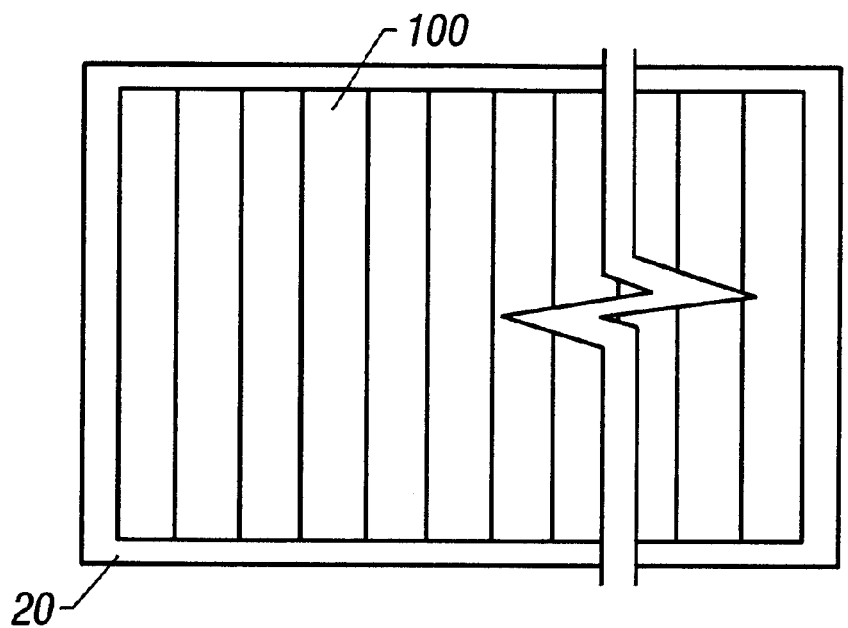

FIG. 5 depicts a select gate and core memory cell after a second polysilicon layer 50 is formed on separation layer 40. Second polysilicon layer 50 defines the control gates of the select transistors and the core memory transistors. Second polysilicon layer 50 also defines the select lines that connect the select gates of different NAND strings and the word lines that connect the core memory cells of different NAND strings. FIG. 10 illustrates a top view of a portion of a NAND array after a second polysilicon layer 100 is formed over the NAND array.

Figure 6:
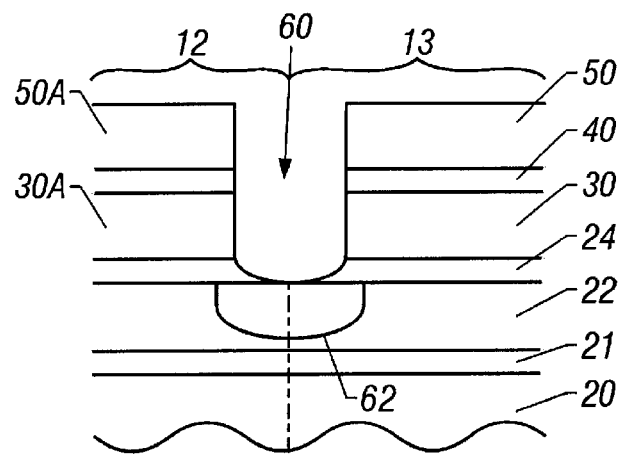
Figure 11:
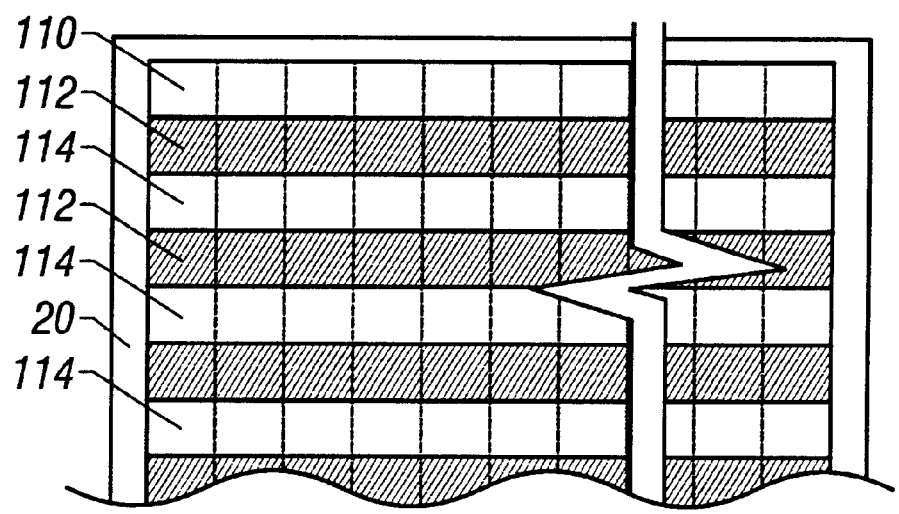

FIG. 6 depicts the structure of FIG. 5 after a section 60 of oxide layer 24, first polysilicon layer 30, separation layer 40, and second polysilicon layer 50 has been etched away, exposing P-well 22. A medium doped source/drain region shared by select transistor 12 and core memory cell 13 is then implanted. A careful selection of the medium doped source/drain region implant conditions is necessary to minimize the band-to-band tunneling current, which can degrade the NAND flash cell program operation and damage the select-gate oxides. In one embodiment, the medium doped source/drain region is doped with Arsenic to a concentration of $10^{13}$–$10^{14}$/cm$^2$. The NAND string has a number of medium doped source/drain regions equal to the number of core memory cells plus one. For example, if a NAND string has 16 core memory cells and two select transistors, the NAND string will have 17 shared medium doped source/drain regions 62. FIG. 11 illustrates a top view of a portion of a NAND array after the second polysilicon layer, separation layer, first polysilicon layer, and oxide layer have been etched away. Medium doped source/drain regions 112 indicate where the layers have been etched away. The remaining second polysilicon layer forms the control gates of the select transistors and the memory cells. In addition, the remaining second polysilicon layer forms select line 110 and wordlines 114.

In one embodiment, first polysilicon layer 30A (FIG. 6) and second polysilicon layer 50A of select transistor 12 are shorted together to form a single control gate instead of a floating gate formed in first polysilicon layer 30 and a control gate formed in second polysilicon layer 50.

Several advantages result from this method of fabricating NAND memory arrays. The single tunnel gate oxidation process eliminates one major masking step, one thermal cycle and associated cleaning and etching steps. Thus, a NAND memory array is less expensive to fabricate using the single tunnel gate oxidation process rather than the dual-gate oxidation process described above. Also, eliminating the masking step eliminates the tolerance space required for the masking step, thus a more compact NAND string can be fabricated using the single tunnel gate oxidation approach.

Elimination of the masking step and the associated buffer oxide etch step also results in increased isolation between the NAND strings. As described above, the NAND strings in the array are separated by core field oxide layers. When the core area is etched back to silicon to form a thick select gate oxide in the dual gate process, some of the core field oxide is also removed. A thinner core field oxide results in reduced isolation integrity between the NAND strings. Reduced isolation integrity can increase susceptibility of the strings to program disturb.

A lower threshold voltage is required to activate the select gate of a NAND string fabricated using the single tunnel gate oxidation process rather than the dual gate process because the thinner select gate oxide increases the current drive of the select gate transistor. In addition, NAND memory arrays formed by the single tunnel gate oxidation process are more reliable and more durable than NAND memory arrays formed by the dual gate process, as demonstrated by in-house endurance cycling tests, read disturb tests, and data retention tests.

Further, NAND memory arrays formed by the single tunnel gate oxidation process show an improved coupling ratio between the floating gate and the control gate. The coupling ratio refers to the voltage drop across the dielectric layer separating the floating gate and the control gate. When a voltage is applied on the control gate, there is a first voltage drop across the dielectric layer separating the floating gate and the control gate, and a second voltage drop across the tunnel oxide layer. It is desirable to maximize the voltage drop across the tunnel oxide layer and minimize the voltage drop across the dielectric layer separating the floating gate and the control gate because the voltage drop across the tunnel oxide layer determines the amount of tunneling current passing through the tunnel oxide during program or erase. As the amount of tunneling current through the tunnel oxide increases, the time required to program or erase the memory device decreases. Elimination of a masking step and related steps in the single tunnel gate oxidation process changes the profile of the core field oxide separating the NAND strings, which has a favorable affect on the coupling ratio, which, for a given voltage, decreases the amount of time required to program or erase the memory device.

Although the invention has been described in terms of certain preferred embodiments, other embodiments apparent to those skilled in the art are also within the scope of this invention. Accordingly, the scope of the invention is intended to be defined only by the claims which follow.

We claim:

1. A NAND flash memory comprising:
   a substrate;
   a first region of first conductivity type;
   a select transistor comprising:
      a select gate oxide layer formed on the first region; and
      a second region of second conductivity type formed in the first region; and
   a memory cell comprising:
      a memory cell oxide layer formed on the first region; and
      a third region of second conductivity type formed in the first region;
   wherein the select gate oxide layer and the memory cell oxide layer are substantially the same thickness.

2. The NAND flash memory of claim 1 further comprising a fourth region of second conductivity type enclosing the first region of first conductivity type.

3. The NAND flash memory of claim 1 wherein the memory cell further comprises:
   a floating gate formed over the memory cell oxide layer;
   a separation layer formed over the floating gate; and
   a control gate formed over the separation layer.

4. The NAND flash memory of claim 3 wherein the separation layer comprises:
   a first oxide layer in contact with the floating gate;
   a nitride layer formed over the first oxide layer; and
   a second oxide layer formed over the nitride layer.

5. The NAND flash memory of claim 3 wherein the floating gate and the control gate are polysilicon.

6. The NAND flash memory of claim 1 wherein the select transistor further comprises a control gate.

7. The NAND flash memory of claim 6 wherein the control gate is polysilicon.

8. The NAND flash memory of claim 1 wherein the second region adjoins the third region.

9. The NAND flash memory of claim 1 wherein the second region and the third region are doped to a concentration of $10^{13}$–$10^{14}$/cm$^2$.

10. The NAND flash memory of claim 1 wherein the select gate oxide layer and the memory cell oxide layer have a thickness of 85 Å–105 Å.

11. The NAND flash memory of claim 1 wherein the select transistor further comprises:
    a floating gate formed over the select gate oxide layer;
    a separation layer formed over the floating gate; and
    a control gate formed over the separation layer.

12. The NAND flash memory of claim 11 wherein the floating gate and the control gate are shorted together to act as a single control gate.

13. The NAND flash memory of claim 11 wherein the control gate is polysilicon.

14. A NAND flash memory array comprising:
    a substrate;
    a first region of first conductivity type formed in the substrate;
    a plurality of NAND strings formed in the first region, each NAND string comprising:
        two select transistors, each select transistor comprising a select transistor oxide layer;
        a plurality of memory cells connected in series between the two select transistors, each memory cell comprising an tunnel oxide layer; wherein each select transistor oxide layer and each tunnel oxide layer are substantially the same thickness; and
        a plurality of regions of second conductivity type, each region of second conductivity type shared by a memory cell and either a select gate or an additional memory cell;
    wherein a first memory cell of a first NAND string is connected to a first memory cell of a second NAND string by a wordline.

15. The NAND flash memory array of claim 14 further comprising an additional region of second conductivity type enclosing the first region of first conductivity type.

16. The NAND flash memory array of claim 14 wherein the first NAND string is separated from the second NAND string by a core field oxide layer.

17. The NAND flash memory array of claim 14 wherein each select transistor oxide layer and each tunnel oxide layer have a thickness between 85 Å–105 Å.

18. The NAND flash memory array of claim 11 wherein each region of second conductivity type is doped to a concentration of $10^{13}$–$10^{14}$/cm$^2$.

19. The NAND flash memory of claim 11 wherein the select transistor further comprises a control gate.

* * * * *

UNITED STATES PATENT AND TRADEMARK OFFICE
CERTIFICATE OF CORRECTION

PATENT NO. : 6,429,479 B1
DATED : August 6, 2002
INVENTOR(S) : Han et al.

It is certified that error appears in the above-identified patent and that said Letters Patent is hereby corrected as shown below:

Column 6,
Lines 23 & 26, delete "claim 11" and insert -- claim 14 --.

Signed and Sealed this

Twentieth Day of May, 2003

JAMES E. ROGAN
*Director of the United States Patent and Trademark Office*